(12) United States Patent
Takenaga et al.

(10) Patent No.: US 10,607,869 B2
(45) Date of Patent: Mar. 31, 2020

(54) SUBSTRATE PROCESSING SYSTEM AND CONTROL DEVICE

(71) Applicant: Tokyo Electron Limited, Tokyo (JP)

(72) Inventors: Yuichi Takenaga, Yamanashi (JP); Takahito Kasai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/936,891

(22) Filed: Mar. 27, 2018

(65) Prior Publication Data
US 2018/0286720 A1    Oct. 4, 2018

(30) Foreign Application Priority Data

Mar. 28, 2017 (JP) .................................. 2017-063791

(51) Int. Cl.
| | |
|---|---|
| *H01L 21/67* | (2006.01) |
| *C23C 14/50* | (2006.01) |
| *B05C 11/10* | (2006.01) |
| *C23C 16/52* | (2006.01) |
| *H01L 21/673* | (2006.01) |

(52) U.S. Cl.
CPC .... *H01L 21/67253* (2013.01); *B05C 11/1005* (2013.01); *C23C 14/50* (2013.01); *C23C 16/52* (2013.01); *H01L 21/67313* (2013.01)

(58) Field of Classification Search
USPC ....... 118/670, 668, 686, 715, 728, 712, 699, 118/729, 665
See application file for complete search history.

(56) References Cited

U.S. PATENT DOCUMENTS

| | | | |
|---|---|---|---|
| 2008/0208385 A1* | 8/2008 | Sakamoto | ........... C23C 16/4412 700/121 |
| 2017/0271218 A1* | 9/2017 | Takenaga | ................ H01L 22/26 |

FOREIGN PATENT DOCUMENTS

JP          2015-179752 A     10/2015

* cited by examiner

*Primary Examiner* — Yewebdar T Tadesse
(74) *Attorney, Agent, or Firm* — Abelman, Frayne & Schwab

(57) ABSTRACT

Disclosed is a substrate processing system that includes a substrate processing apparatus configured to perform a predetermined processing on a substrate accommodated in a processing container. The substrate processing system includes: a processing execution unit configured to execute a film deposition processing on the substrate; a characteristic acquiring unit configured to acquire the characteristic of the film deposited on the substrate by the film deposition processing; and an abnormality determination unit configured to determine whether the characteristic of the film includes an abnormal value based on the characteristic of the film acquired by the characteristic acquiring unit.

5 Claims, 6 Drawing Sheets

SUBSTRATE PROCESSING SYSTEM AND CONTROL DEVICE

CROSS-REFERENCE TO RELATED APPLICATION

This application is based on and claims priority from Japanese Patent Application No. 2017-063791 filed on Mar. 28, 2017 with the Japan Patent Office, the disclosure of which is incorporated herein in its entirety by reference.

TECHNICAL FIELD

The present disclosure relates to a substrate processing system and a control device.

BACKGROUND

In the related art, a substrate processing apparatus that performs a predetermined process on a substrate such as a semiconductor wafer has been used in a semiconductor manufacturing process. In such a substrate processing apparatus, the characteristics or the like of a film deposited on the substrate are measured by a measuring device, and process conditions are calculated using the measurement results (see, e.g., Japanese Patent Laid-Open Publication No. 2015-179752).

SUMMARY

A substrate processing system according to an aspect of the present disclosure includes: a substrate processing apparatus configured to perform a predetermined processing on a substrate accommodated in a processing container: a processing execution unit configured to execute a film deposition processing on the substrate; a characteristic acquiring unit configured to acquire a characteristic of a film deposited on the substrate by the film deposition processing; and an abnormality determination unit configured to determine whether the characteristic of the film includes an abnormal value based on the characteristic of the film acquired by the characteristic acquiring unit.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
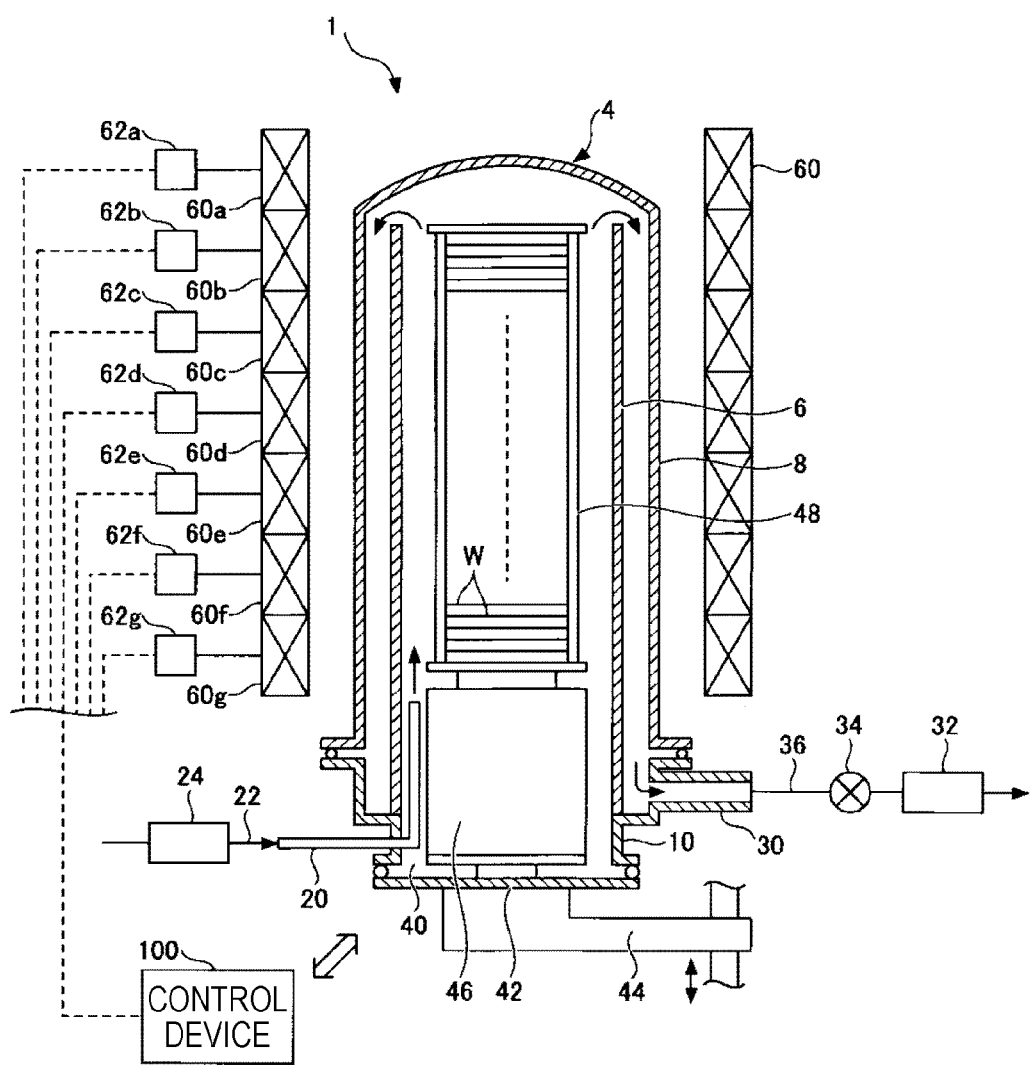
FIG. 1 is a schematic cross-sectional view of a substrate processing system according to an exemplary embodiment of the present disclosure.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

The characteristic of the film at a certain measurement point may suddenly represent an abnormal value due to the abnormality of the substrate processing apparatus or the measuring device. Further, when process conditions are calculated using the measurement results including the abnormal value, it may be impossible to calculate appropriate process conditions. In addition, the time required to calculate the process conditions may become longer. Further, when the Run-to-Run control is performed, there is a risk that product defects or the like may occur due to a feedback control based on measurement results including abnormal values.

The present disclosure has been made in consideration of the foregoing and provides a substrate processing system capable of detecting an abnormal value of the characteristic of a film deposited on a substrate with high accuracy.

A substrate processing system according to an aspect of the present disclosure includes: a substrate processing apparatus configured to perform a predetermined processing on a substrate accommodated in a processing container: a processing execution unit configured to execute a film deposition processing on the substrate; a characteristic acquiring unit configured to acquire a characteristic of a film deposited on the substrate by the film deposition processing; and an abnormality determination unit configured to determine whether the characteristic of the film includes an abnormal value based on the characteristic of the film acquired by the characteristic acquiring unit.

In the above-described substrate processing system, the characteristic of the film is associated with the distance from the center of the substrate. The abnormality determination unit determines whether the characteristic of the film includes an abnormal value based on the relationship between the distance from the center of the substrate and the characteristic of the film acquired by the characteristic acquiring unit.

The above-described substrate processing system further includes a substrate holder accommodated in the processing container and having a plurality of slots for holding the substrate. The characteristic of the film is associated with the plurality of slots. The abnormality determination unit determines whether the characteristic of the film include an abnormal value based on the relationship between the slots and the characteristic of the film acquired by the characteristic acquiring unit.

In the above-described substrate processing system, the abnormality determination unit determines whether the characteristic of the film include an abnormal value based on a currently set first process condition, a previously set second process condition, a characteristic of a film deposited under the second process condition, and a characteristic of a film deposited under the first process condition estimated based on the process model representing the influence of the process conditions on the film deposition result.

The above-described substrate processing system has a warning output unit that outputs a warning message when the abnormality determination unit determines that the characteristic of the film includes an abnormal value.

The control device according to the aspect of the present disclosure is a control device that controls a substrate processing apparatus configured to perform a predetermined process on the substrate accommodated in the processing container. The control device includes: a processing execution unit that executes a film deposition processing on the substrate; a characteristic acquiring unit that acquires the characteristic of the film deposited on the substrate by the film deposition processing; and an abnormality determination unit that determines whether the characteristic of the film include an abnormal value based on the characteristic of the film acquired by the characteristic acquiring unit.

According to the substrate processing system of the present disclosure, it is possible to detect an abnormal value of a characteristic of a film deposited on a substrate with high accuracy.

Hereinafter, modes for implementing the present disclosure will be described with reference to the accompanying drawings. In the drawings, substantially the same components are denoted by the same reference numerals, and a repeated description thereof will be omitted.

(Substrate Processing System)

The substrate processing system of the present disclosure will be described. FIG. 1 is a schematic cross-sectional view of the substrate processing system according to an exemplary embodiment of the present disclosure.

As illustrated in FIG. 1, the substrate processing system includes a substrate processing apparatus 1 and a control device 100.

The substrate processing apparatus 1 is, for example, a batch type apparatus that is capable of collectively performing a film deposition processing on a plurality of substrates accommodated in a processing container 4. The substrates may be, for example, semiconductor wafers (hereinafter, referred to as "wafers W").

The control device 100 is, for example, a computer and includes a central processing unit (CPU), a random access memory (RAM), a read only memory (ROM), an auxiliary storage device, and the like. The CPU is operated based on a program stored in the ROM or the auxiliary storage device, and controls the operation of the substrate processing apparatus 1. The control device 100 may be provided inside or outside the substrate processing apparatus 1. When the control device 100 is provided outside the substrate processing apparatus 1, the control device 100 may control the substrate processing apparatus 1 by a wired or wireless communication unit. Further, the control device 100 may also be connected to a group controller or a host computer which is a control device for collectively managing a plurality of devices including the substrate processing apparatus 1 by a wired or wireless communication unit.

(Substrate Processing Apparatus)

As illustrated in FIG. 1, the substrate processing apparatus 1 has a substantially cylindrical processing container 4 of which the longitudinal direction is vertical. The processing container 4 has a double pipe structure including an inner cylinder 6 and an outer cylinder 8 having a ceiling arranged concentrically outside the inner cylinder 6. The inner cylinder 6 and the outer cylinder 8 are formed of, for example, a heat-resistant material such as quartz.

The lower ends of the inner cylinder 6 and the outer cylinder 8 are held by a manifold 10 formed of stainless steel or the like. The manifold 10 is fixed, for example, to a base plate (not illustrated). Further, since the manifold 10, the inner cylinder 6, and the outer cylinder 8 form an inner space of a substantially cylindrical shape, these components are assumed to form a portion of the processing container 4.

That is, the processing container 4 includes an inner cylinder 6 and an outer cylinder 8 formed of, for example, a heat-resistant material such as quartz, and a manifold 10 formed of stainless steel or the like, and the manifold 10 is provided below the side surface of the processing container 4 so as to hold the inner cylinder 6 and the outer cylinder 8 from below.

The manifold 10 has a gas introducing portion 20 that introduces various gases such as a film deposition gas used for a film deposition processing, a processing gas such as an additive gas, and a purging gas used for purging, into the processing container 4. FIG. 1 illustrates a configuration in which one gas introducing portion 20 is provided. However, the present disclosure is not limited to this, and a plurality of gas introducing portions 20 may be provided depending on the type of a gas to be used or the like.

The type of the processing gas is not particularly limited, and may be selected as appropriate depending on the type of a film to be deposited. The processing gas may be, for example, a silicon-containing gas.

The type of the purging gas is not particularly limited, and, for example, an inert gas such as nitrogen ($N_2$) gas may be used.

An introducing pipe 22 that introduces various gases into the processing container 4 is connected to the gas introducing portion 20. Further, the introducing pipe 22 is provided with a flow rate adjusting unit 24 such as a mass flow controller for adjusting the gas flow rate and a valve (not illustrated).

Further, the manifold 10 has a gas exhaust unit 30 that evacuates the inside of the processing container 4. The gas exhaust unit 30 is connected to an exhaust pipe 36 including a vacuum pump 32 capable of controlling the decompression of the inside of the processing container 4, an opening degree variable valve 34, and the like.

A furnace opening 40 is formed in the lower portion of the manifold 10, and, for example, a disk-shaped lid 42 formed of stainless steel or the like is provided in the furnace opening 40. The lid 42 is provided so as to be movable up and down by, for example, an elevating mechanism 44 functioning as a boat elevator, and is configured to hermetically seal the furnace opening 40.

A heat insulating cylinder 46 made of, for example, quartz is installed on the lid 42. A wafer boat 48 made of, for example, quartz, which holds, for example, about 50 to 175 wafers W in a horizontal state at a predetermined interval in multiple stages, is disposed on the heat insulating cylinder 46. The wafer boat 48 is an example of a substrate holder. Hereinafter, an area where a wafer W is held will be referred to as a slot. In the exemplary embodiment of the present disclosure, 175 slots are provided. Further, each slot is represented by a number from 1 to 175, and a smaller number is assigned to a slot closer to the upper side.

The wafer boat 48 is loaded (carried) into the processing container 4 by raising the lid 42 using the elevating mechanism 44, and various film deposition processings are performed on the wafers W held in the wafer boat 48. After the various film deposition processings are performed, the lid 42 is lowered using the elevating mechanism 44, so that the wafer boat 48 is unloaded (carried out) from the processing container 4 to the lower loading area.

For example, a cylindrical heater 60 capable of heating the processing container 4 to a predetermined temperature in a controlled manner is provided on the outer peripheral side of the processing container 4.

The heater 60 is divided into a plurality of zones, and heaters 60a to 60g are provided from the upper side to the lower side in the vertical direction. The heaters 60a to 60g are configured to independently control the calorific values by power controllers 62a to 62g, respectively. In addition, a temperature sensor (not illustrated) corresponding to the heaters 60a to 60g, respectively, is provided on the inner wall of the inner cylinder 6 and/or the outer wall of the outer cylinder 8. Further, FIG. 1 illustrates the heater 60 divided into seven zones. However, the present disclosure is not limited to this, and the heater 60 may be divided into six or less zones or eight or more zones from the upper side to the lower side in the vertical direction. Also, the heater 60 may not be divided into a plurality of zones.

(Control Device)

Figure 2:
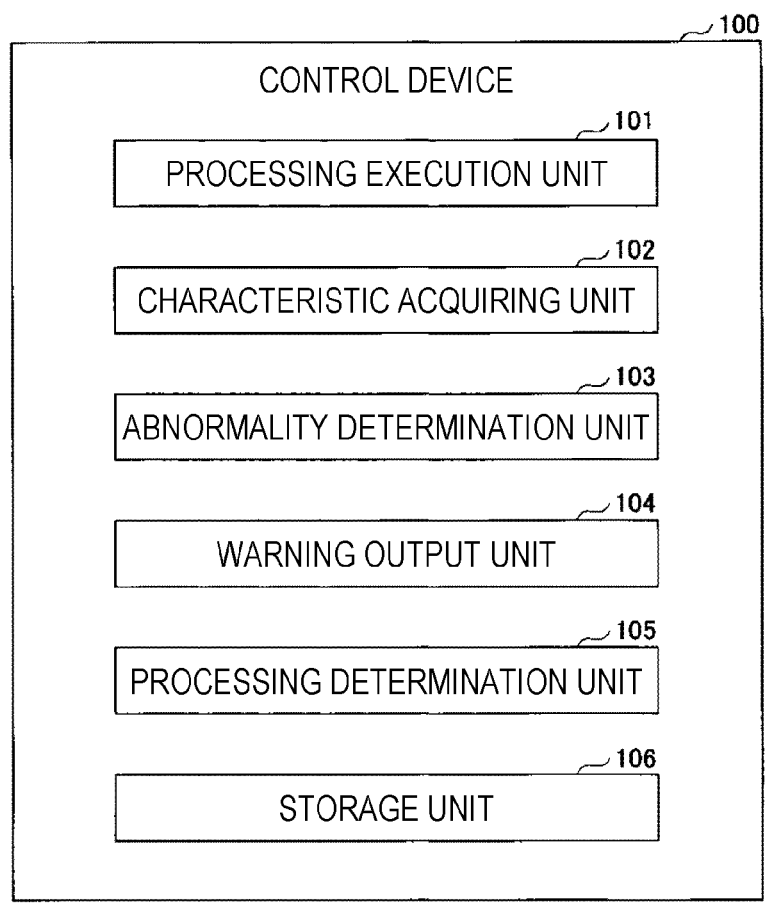
FIG. 2 is a view for explaining a functional configuration of a control device according to the exemplary embodiment of the present disclosure.

The control device 100 according to the exemplary embodiment of the present disclosure will be described. FIG. 2 is a view for explaining the functional configuration of the control device 100 according to the exemplary embodiment of the present disclosure.

As illustrated in FIG. 2, the control device 100 includes a processing execution unit 101, a characteristic acquiring unit 102, an abnormality determination unit 103, a warning output unit 104, a processing determination unit 105, and a storage unit 106.

The processing execution unit 101 performs a film deposition processing for a plurality of wafers W based on the process conditions selected by a user or the like.

The characteristic acquiring unit acquires a characteristic of the film deposited on the wafer W. Specifically, the characteristic acquiring unit 102 acquires, for example, a characteristic of the film corresponding to the distance from the center of the wafer W and a characteristic of the film corresponding to a slot. A characteristic of the film measured by a measuring device may be, for example, a film thickness or an impurity concentration in the film.

The abnormality determination unit 103 determines whether the characteristic of the film includes an abnormal value based on the characteristics of the film acquired by the characteristic acquiring unit 102.

Figure 3:
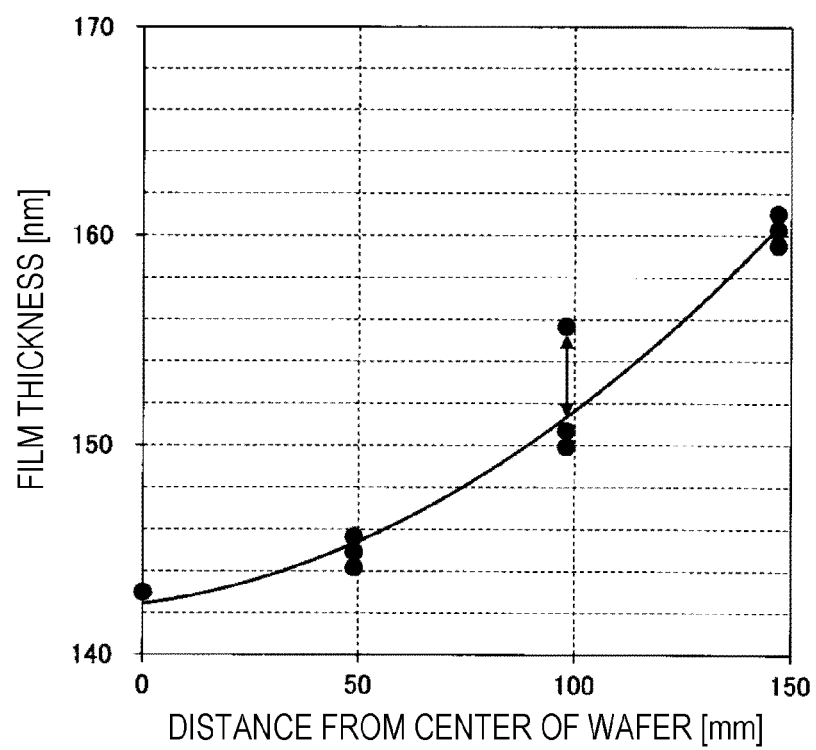
FIG. 3 is a view illustrating a relationship between a distance from a center of a wafer and a film thickness.

FIG. 3 is a view illustrating a relationship between the distance from the center of the wafer and the film thickness. In FIG. 3, the horizontal axis indicates the distance (mm) from the center of the wafer W, and the vertical axis indicates the film thickness (nm). For example, as illustrated in FIG. 3, the abnormality determination unit 103 calculates an approximation curve (indicated by a solid line in the figure) based on the relationship between the distance from the center of the wafer W and the film thickness acquired by the characteristic acquiring unit 102, and calculates a difference between the actually measured value of the film thickness and the predicted value of the film thickness predicted from the approximation curve (indicated by a double-headed arrow in the figure) at each measurement point. When the difference between the actually measured value and the predicted value is equal to or larger than a first value, the abnormality determination unit 103 determines that the measurement point is an abnormal point. In the meantime, when the difference between the actually measured value and the predicted value is smaller than the first value, the abnormality determination unit 103 determines that the measurement point is not an abnormal point. Also, the first value is a value determined by the user or the like in advance.

Figure 4:
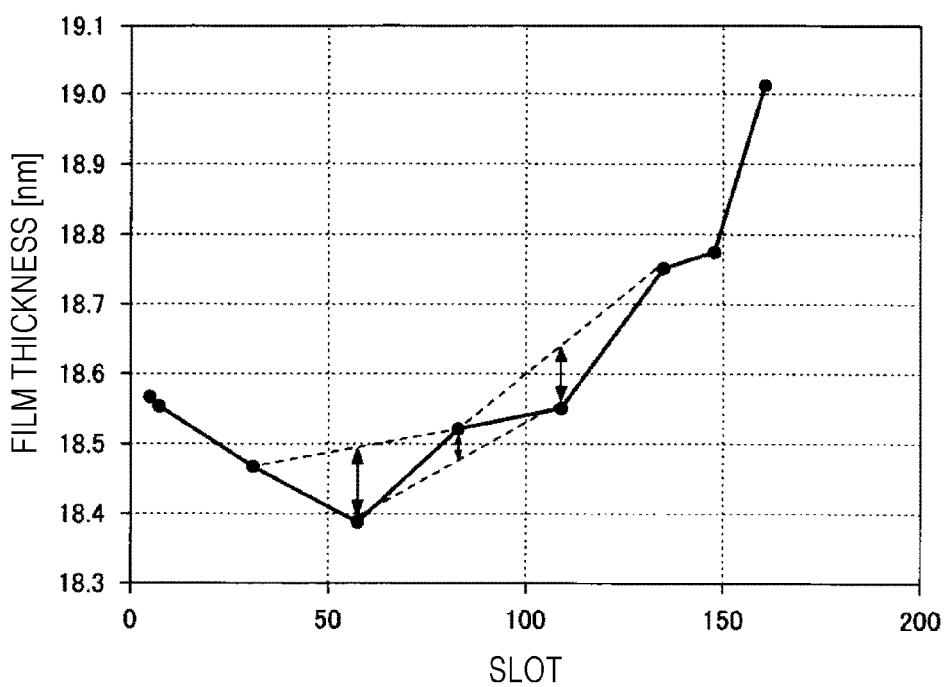
FIG. 4 is a view illustrating a relationship between a slot and a film thickness.

FIG. 4 is a view illustrating a relationship between the slot and the film thickness. In FIG. 4, the horizontal axis indicates the slot and the vertical axis indicates the film thickness (nm). For example, as illustrated in FIG. 4, the abnormality determination unit 103 determines the difference (indicated by a double-headed arrow in the figure) between the actually measured value of the film thickness of one slot and the predicted value of the film thickness predicted from the line (indicated by a broken line in the figure) passing through the actually measured value of the film thickness in two slots adjacent to the slot based on the relationship between the slot and the film thickness acquired by the characteristic acquiring unit. Further, when the difference between the actually measured value and the predicted value is greater than or equal to a second value at each measurement point, the abnormality determination 103 determines that the measurement point is an abnormal point. In the meantime, when the difference between the actually measured value and the predicted value is smaller than the second value, the abnormality determination unit 103 determines that the measurement point is not an abnormal point. Further, the second value is a value determined by the user or the like in advance. In addition, it may be excluded that the characteristic of the film locally changes due to the influence of the support pillars or claws of the wafer boat 48 in a plurality of measurement points acquired by the characteristic acquiring unit 102 when calculating the approximation curve. The measurement points to be excluded are determined by the user or the like.

Figure 5:
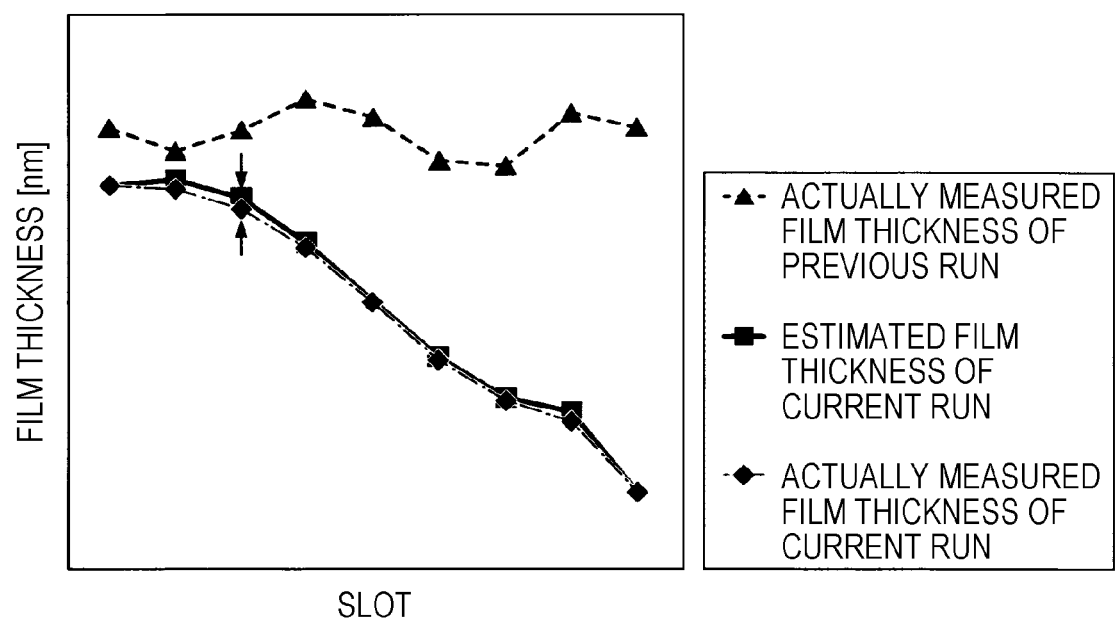
FIG. 5 is a view illustrating a relationship between a slot and a film thickness.

FIG. 5 is a view illustrating a relationship between the slot and the film thickness. In FIG. 5, the horizontal axis indicates the slot and the vertical axis indicates the film thickness (nm). In FIG. 5, the line plotted with diamond marks indicates the actually measured values of the thickness of a film deposited under the currently set process conditions, and the line plotted with triangular marks indicates the actually measured values of the thickness of a film deposited under the previously set process conditions. Also, the line plotted with square marks indicates estimated values of the thickness of a film deposited under the currently set process conditions. For example, as illustrated in FIG. 5, the abnormality determination unit 103 calculates the differences (indicated by an arrow in the figure) between an actually measured value of the thickness of the film deposited under the currently set process conditions (first process condition) and an estimated value of the thickness of the film deposited under the first process condition. When a difference between the actually measured value and the estimated value is greater than or equal to a third value at each measurement point, the abnormality determination unit 103 determines that the measurement point is an abnormal point. In the meantime, when the difference between the actually measured value and the estimated value is smaller than the third value, the abnormality determination unit 103 determines that the measurement point is not an abnormal point. Further, the third value is the value determined by the user or the like in advance. In addition, the estimated value of the thickness of the film deposited under the first process condition may be estimated based on, for example, the first process condition, the previously set process condition (second process condition), the thickness of the film deposited under the second process condition, and the process model that represents the influence of the process conditions on the film deposition results. Examples of the process model include, for example, a wafer temperature-film deposition amount model, which represents the influence of the temperature of the wafer W on the film thickness of the deposited film (the film deposition amount on the wafer W) and a pressure-film deposition amount model, which represents the influence of the pressure in the processing container 4 on the film thickness of the deposited film (the film deposition amount on the wafer W).

When the abnormality determination unit 103 determines that the characteristic of the film include an abnormal value, the warning output unit 104 outputs a warning message including the fact that the film deposition result is abnormal. In addition, the warning output unit 104 may remove the abnormal value in addition to or instead of the output of the warning message. Further, instead of removing the abnormal value, the warning output unit 104 may replace the abnormal value with the predicted value or the estimated value calculated by the abnormality determination unit 103.

The processing determination unit 105 determines whether an operation of continuing the process from the user or the like has been received within a predetermined time. In addition, the processing determination unit 105 determines whether the user or the like has taken measures.

The storage unit 106 stores various process conditions, process models, and the like.

(Abnormality Determination Processing)

An abnormality determination processing according to the exemplary embodiment of the present disclosure will be described. In the abnormality determination processing according to the exemplary embodiment of the present disclosure, for example, the characteristics of the film deposited on the wafer W, or the like are measured by a measuring device, and the measurement results may be used for recipe optimization calculation such as calculation of process conditions. Further, the abnormality determination processing according to the exemplary embodiment of the present disclosure may be used for diagnosing the health condition of an apparatus such as, for example, fault detection & classification (FDC) or statistical process control (SPC).

Figure 6:
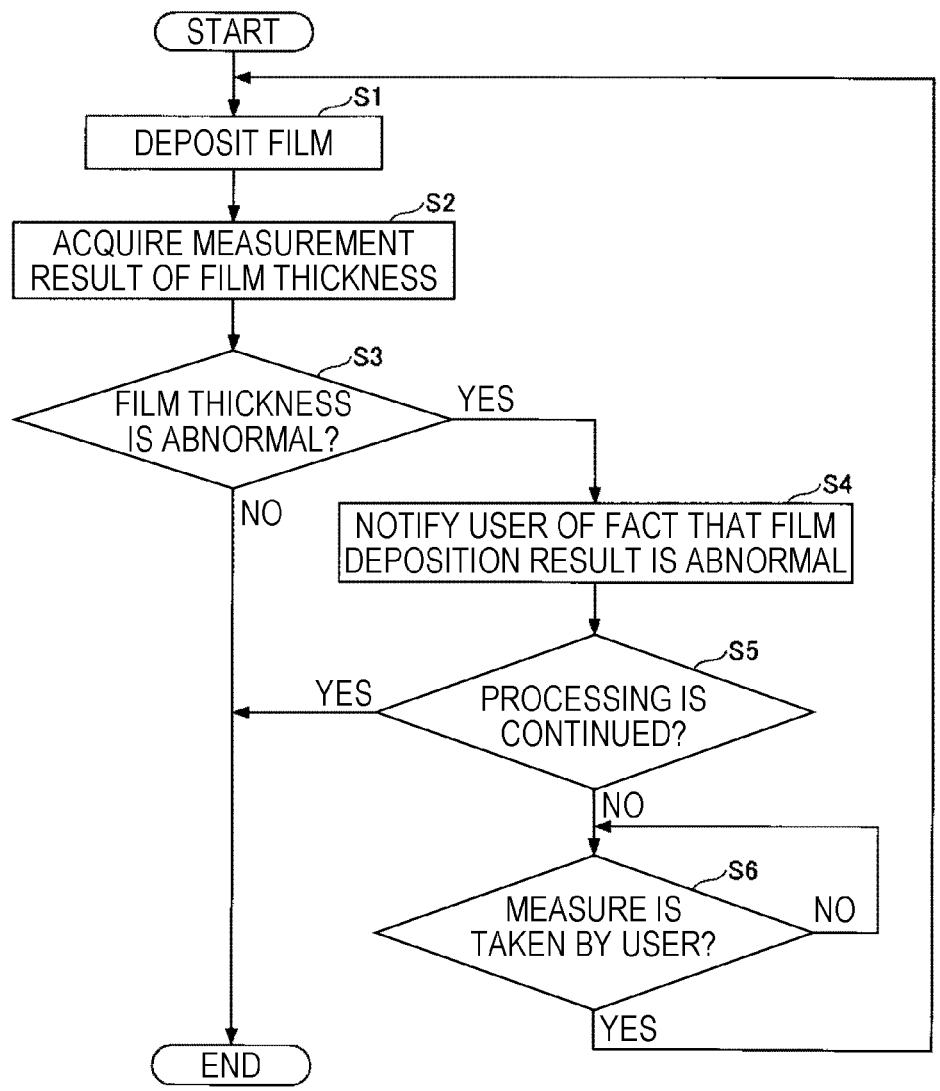
FIG. 6 is a flowchart illustrating an example of an abnormal point removal process according to the exemplary embodiment of the present disclosure.

FIG. 6 is a flowchart illustrating an example of an abnormality determination processing according to the exemplary embodiment of the present disclosure. When a process condition is selected by the user or the like and the operation of film deposition is performed, the abnormality determination processing illustrated in the flowchart of FIG. 6 is initiated.

In step S1, the processing execution unit 101 executes a film deposition processing for a plurality of wafers W based on the process conditions selected by the user or the like. At least a portion of the wafers W on which the film deposition processing is performed is measured by a measuring device for the characteristics such as the film thickness.

In step S2, the characteristic acquiring unit 102 acquires the characteristics of the film deposited on the wafer W in step S1.

In step S3, the abnormality determination unit 103 determines whether the characteristics of the film include an abnormal value based on the characteristics of the film acquired by the characteristic acquiring unit 102. When it is determined in step S3 that the characteristics of the film include an abnormal value, the process proceeds to step S4. In the meantime, when it is determined in step S3 that the characteristics of the film do not include an abnormal value, the process is terminated.

In step S4, the warning output unit 104 outputs a warning message including the fact that the film deposition result is abnormal. The user or the like may easily and quickly determine whether the characteristics of the film include an abnormal value by confirming the warning message output by the warning output unit 104. In addition, when the user or the like confirms the warning message and then determines that the characteristics of the film do not include any abnormal values, the user may perform the operation of continuing the process.

In step S5, the processing determination unit 105 determines whether an operation of continuing the process by the user or the like has been received within a predetermined time. When it is determined in step S5 that the user or the like has received an operation of continuing the process within a predetermined time, the process is terminated. In the meantime, when it is determined that the operation of continuing the process by the user or the like has not been received within a predetermined time, the process proceeds to step S6.

In step S6, the processing determination unit 105 determines whether the user or the like has taken measures. When it is determined in step S6 that the user or the like has taken measures, the process proceeds to step S1. In the meantime, when it is determined in step S6 that the user or the like has not taken any measure, step S6 is repeated again.

As described above, in the exemplary embodiment of the present disclosure, the control device 100 determines whether the characteristics of the film include an abnormal value based on the characteristics of the film deposited on the wafer W. Thus, it is possible to detect the abnormal value of the characteristics of the film deposited on the wafer W with high accuracy. As a result, the burden on the user or the like may be reduced, and the time required for detecting the abnormal value may be shortened.

When the characteristic of the film include an abnormal value, the control device 100 displays a warning message including the fact that the film deposition result is abnormal, and notifies the user or the like of the warning message. Thus, when the recipe optimization calculation such as the calculation of process conditions is performed using the measurement results, it is possible to suppress the recipe optimization calculation from being performed in a state in which the abnormal value is included.

In the above-described exemplary embodiment, the case where the control device 100 controlling the operation of the substrate processing apparatus 1 performs the abnormality determination processing has been described as an example, but the present disclosure is not limited to this. For example, a group controller or a host computer connected to the control device 100 by a wired or wireless communication unit may perform the abnormality determination processing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system comprising:
    a substrate processing apparatus including a processing container and a substrate holder accommodated in the processing container and having therein a plurality of slots provided in a vertical direction each of which holds a substrate, the substrate processing apparatus being configured to perform a predetermined processing on the substrate held in a slot of the plurality of slots; and
    a controller configured to control the substrate processing apparatus,
    wherein the controller is configured to:
        execute a film deposition processing on the substrate;

acquire a characteristic of a film deposited on the substrate by the film deposition processing in which the characteristic of the film is associated with the plurality of slots; and determine whether the characteristic of the film includes an abnormal value based on a relationship between a position of each of the plurality of slots within the substrate holder and the characteristic of the film, wherein the relationship between the position of each of the plurality of slots within the substrate holder and the characteristic of the film includes a relationship between a position of each of the plurality of slots that holds the substrate within the substrate holder with reference to a top of the substrate holder and a thickness of the film.

2. The substrate processing system of claim 1, wherein the characteristic of the film is associated with a distance from a center of the substrate, and the controller is configured to determine whether the characteristic of the film includes the abnormal value based on a relationship between the distance from the center of the substrate and the characteristic of the film.

3. The substrate processing system of claim 1, wherein the controller is configured to determine whether the characteristic of the film includes the abnormal value based on a currently set first process condition, a previously set second process condition, a characteristic of a film deposited under the second process condition, and a characteristic of a film deposited under the first process condition estimated based on a process model which represents an influence of a process condition on a film deposition result.

4. The substrate processing system of claim 1, wherein the controller is configured to output a warning message when it is determined that the characteristic of the film includes the abnormal value.

5. A controller that controls a substrate processing apparatus configured to perform a predetermined processing on a substrate, the substrate processing apparatus including a processing container and a substrate holder accommodated in the processing container and having therein a plurality of slots provided in a vertical direction each of which holds a substrate, wherein the controller is configured to:

execute a film deposition processing on the substrate;

acquire a characteristic of a film deposited on the substrate by the film deposition processing in which the characteristic of the film is associated with the plurality of slots; and determine whether the characteristic of the film includes an abnormal value based on a relationship between a position of each of the plurality of slots within the substrate holder and the characteristic of the film, wherein the relationship between the position of each of the plurality of slots within the substrate holder and the characteristic of the film includes a relationship between a position of each of the plurality of slots that holds the substrate within the substrate holder with reference to a top of the substrate holder and a thickness of the film.

* * * * *